(12) United States Patent
Gorcea (10) Patent No.: US 6,566,947 B2
(45) Date of Patent: May 20, 2003

(54) COMBINED ACTIVE IMPEDANCE AND FILTER IN LINE DRIVERS

(75) Inventor: Dan V. Gorcea, Kanata (CA)

(73) Assignee: Nortel Networks Limited, Montreal (CA)

( * ) Notice: Subject to any disclaimer, the term of this patent is extended or adjusted under 35 U.S.C. 154(b) by 76 days.

(21) Appl. No.: 09/746,422

(22) Filed: Dec. 26, 2000

(65) Prior Publication Data

US 2002/0121930 A1 Sep. 5, 2002

(51) Int. Cl.$^7$ .............. H03F 1/36; H03F 3/45; H03F 1/00
(52) U.S. Cl. .............. 330/75; 330/69; 330/79; 330/85; 330/103; 330/195
(58) Field of Search .............. 330/69, 75, 79, 330/85, 103, 169, 195

(56) References Cited

U.S. PATENT DOCUMENTS

| | | | | |
|---|---|---|---|---|
| 3,872,253 A | * | 3/1975 | Jurschak | 379/106.01 |
| 4,306,122 A | * | 12/1981 | Nijman et al. | 379/377 |
| 6,028,479 A | * | 2/2000 | Babanezhad | 330/253 |
| 6,218,872 B1 | * | 4/2001 | Koren | 327/108 |

* cited by examiner

Primary Examiner—Patricia T. Nguyen

(57) ABSTRACT

A line driver combining active impedance and filter in one stage for connection to a transmission line having a characteristic impedance. The line driver comprises an amplifier, a transformer with a primary to secondary winding ratio of 1:n, a reference impedance, an input impedance and two feedback impedances. The primary winding of the transformer has a first end connected to the output of the amplifier and the secondary winding is connectable to the transmission line. The reference resistor has an end connected to the second end of the first winding at a junction node and the feedback circuit is connected to the input and output of the amplifier and also to the junction node. The reference impedance has a value equal to $$\frac{n^2}{K}$$

times the characteristic impedance of the transmission line. The feedback circuit is arranged to produce a voltage at the output of the amplifier substantially equal to (K+1) times the voltage at the junction node, for a predetermined value of K. This results in output impedance equal to $n^2$ times the characteristic impedance of the transmission line. At the same time, the gain or filter function is set by the specifying the ratio of feedback impedance to the input impedance.

13 Claims, 6 Drawing Sheets

COMBINED ACTIVE IMPEDANCE AND FILTER IN LINE DRIVERS

FIELD OF THE INVENTION

This invention relates generally to line drivers and particularly to line drivers having desirable output impedance and filtering capabilities in a single amplifier stage.

BACKGROUND OF THE INVENTION

DSL (digital subscriber line) is a technology for bringing high-bandwidth information to homes and small businesses over ordinary copper telephones lines. xDSL refers to different variations of DSL such as ADSL (asymmetric DSL), G.Lite DSL (ITU-T standard G-992.2), HDASL (high bit-rate DSL) and RADSL (rate-adaptive DSL).

DSL modems are typically installed in pairs, with one of the modems installed in a home (customer's premises) and the other in the telephone company's central office servicing that home. The pair of xDSL modems are connected to the opposite ends of the same twisted-pair transmission line.

Figure 1:
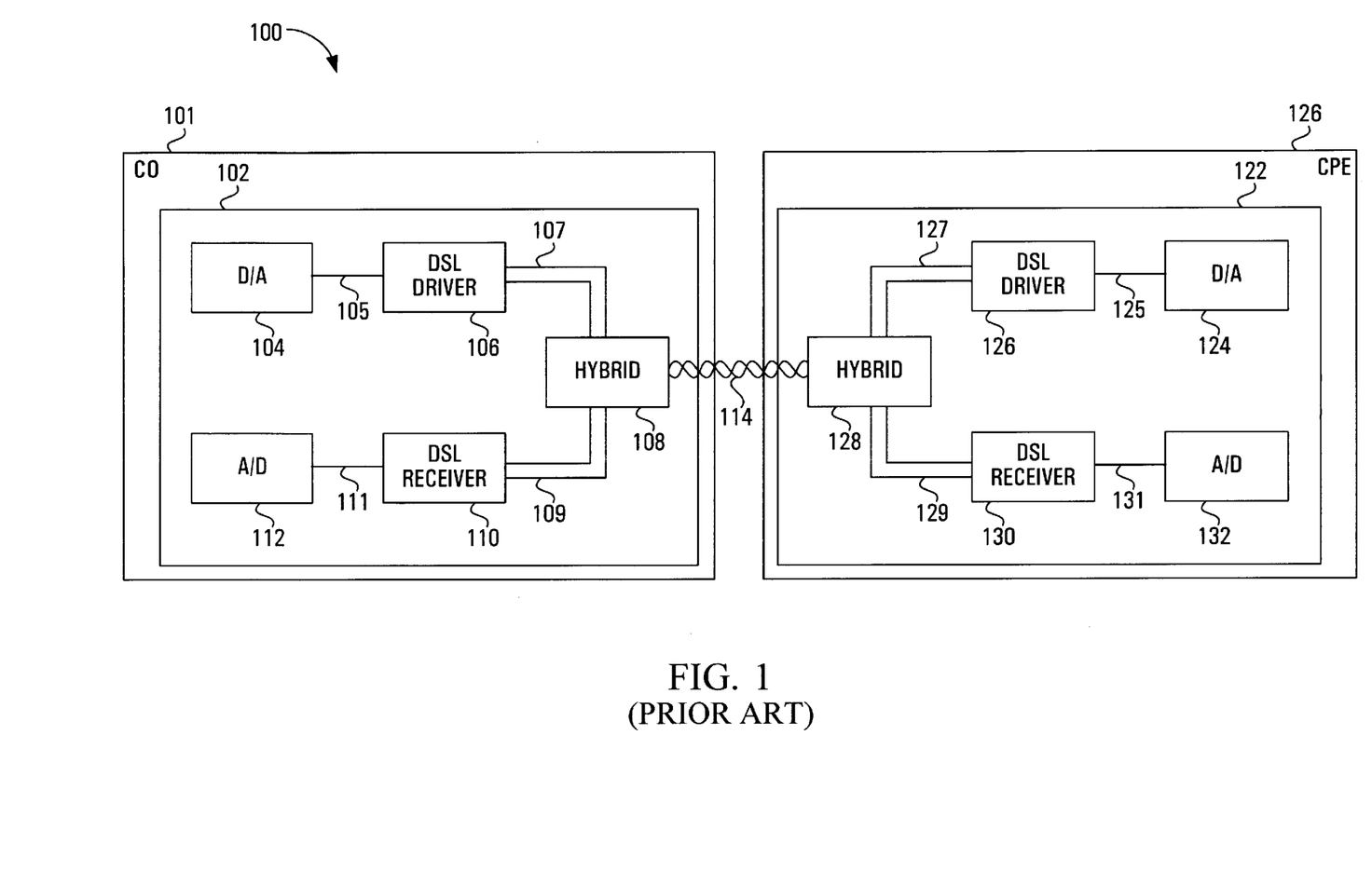
FIG. 1 is a block diagram of a conventional xDSL communication system.

Referring to FIG. 1 a conventional xDSL communication system 100 comprises a CO (central office) 101. The CO 101 has a plurality of xDSL modems 102 (only one shown). The xDSL modem 102 has a D/A (digital to analog) converter 104. An output of the D/A converter 104 is connected 105 to an input of an xDSL driver 106. An output of the xDSL driver 106 is connected 107 to a 4-wire input of a hybrid 108. A 4-wire output of the hybrid 108 is connected 109 to an input of an xDSL receiver 110. An output of the xDSL receiver 110 is connected 111 to the input of an A/D (analog to digital) converter 112. A 2-wire port of the hybrid 108 is connected to a transmission line 114, such as copper twisted pair.

The xDSL communication system 100 also comprises CPE (customer premises equipment) 126. The CPE 126 has an xDSL modem 122. The xDSL modem 122 has a D/A converter 124. An output of the D/A converter 124 is connected 125 to an input of an xDSL driver 126. An output of the xDSL driver 126 is connected 127 to a 4-wire input of a hybrid 128. A 4-wire output of the hybrid 128 is connected 129 to an input of an xDSL receiver 130. An output of the xDSL receiver 130 is connected 131 to an input of an A/D converter 132. The 2-wire port of the hybrid 128 is connected to the transmission line 114.

Figure 2:
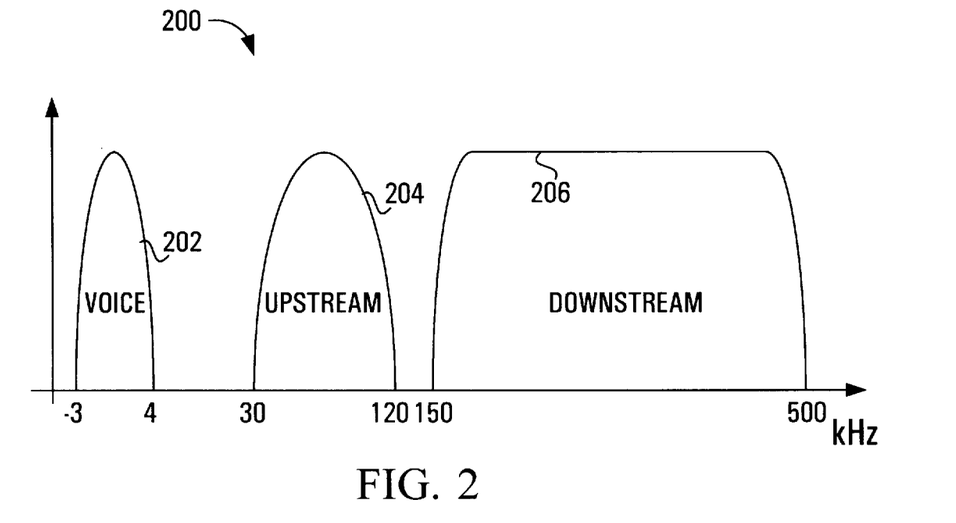
FIG. 2 is a frequency spectrum plan of a G.Lite DSL communication system.

Since an xDSL modem operates at frequencies higher than the voice-band frequencies, an xDSL modem may operate simultaneously with a voice-band modem or a telephone conversation. Referring to FIG. 2, there is shown an example of a frequency spectrum plan 200 for a G.Lite DSL system on the transmission line 114 of FIG. 1. The frequency range from 0.3 to 4 kHz 202 is occupied by conventional voice communications. The frequency range from 30 to 120 kHz 204 is occupied by upstream (CPE 126 to CO 101) data transmission. The frequency range from 150 kHz to approximately 500 kHz 206 is occupied by downstream (CO 101 to CPE 126) data transmission. The upper frequency limit of the downstream data transmission is determined by the length and quality of the transmission line 114.

Figure 3:
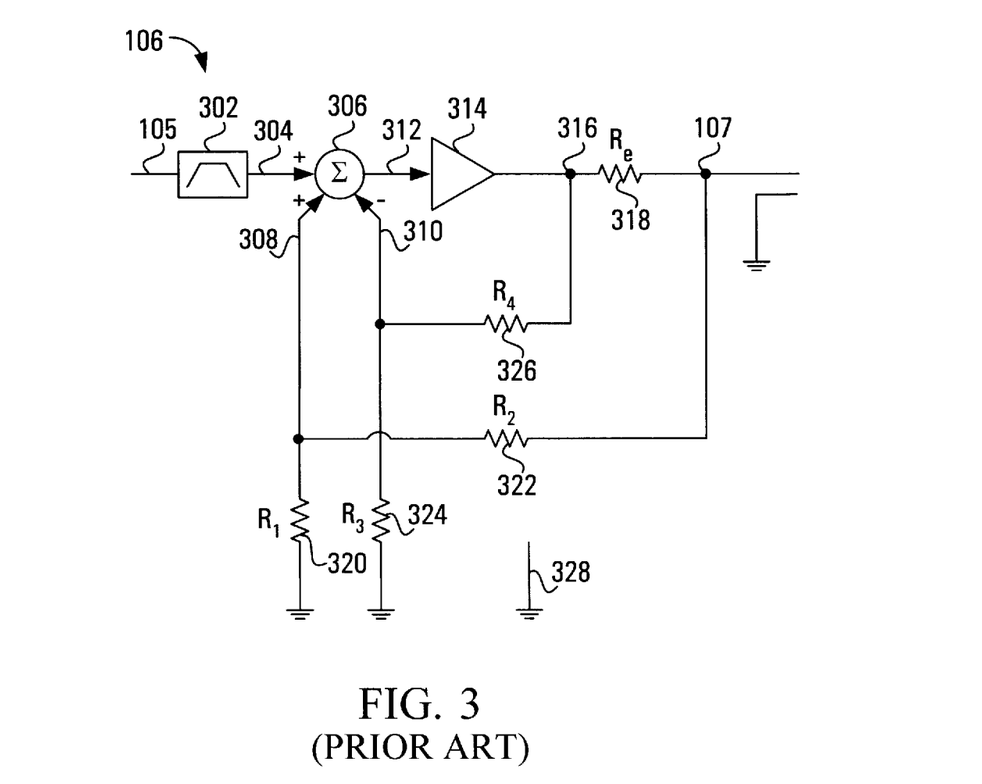
FIG. 3 is a circuit diagram of a conventional xDSL driver used in the CO of the xDSL communication system of FIG. 1.

Referring to FIG. 3, there is shown a conventional implementation of the xDSL driver 106 of FIG. 1. The input of the xDSL driver 106 is connected 105 to an input of a bandpass filter 302. The output of the bandpass filter 302 is connected to a first non-inverting input 304 of a summation circuit 306. The output of the summation circuit 306 is connected to an input 312 of an amplifier 314. An output of the amplifier 314 is connected 316 to a first terminal of a reference resistor $R_e$ 318. A second terminal of the reference resistor $R_e$ 318 is connected to the output of the xDSL driver 107. A resistor $R_1$ 320 is connected from a second non-inverting input 308 of the summation circuit to ground 328. A resistor $R_2$ 322 is connected from output 107 of the xDSL driver 106 to the second non-inverting input 308 of the summation circuit 306. A resistor $R_3$ 324 is connected from an inverting input 310 of the summation circuit 306 to ground 328. A resistor $R_4$ 326 is connected 316 from the output of the power amplifier 314 to the inverting input 310 of the summation circuit 306.

Figure 4:
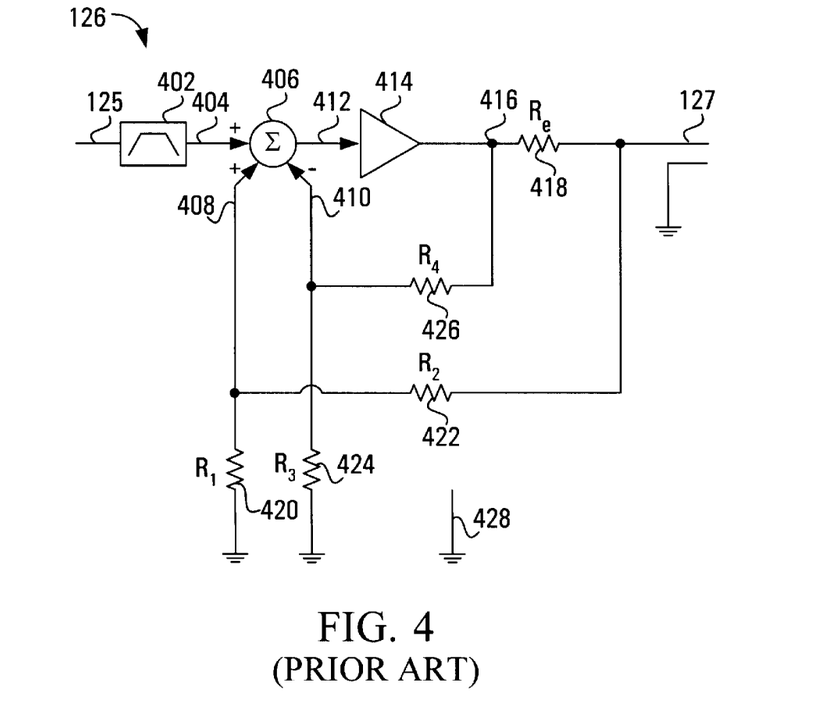
FIG. 4 is a circuit diagram of a conventional xDSL driver used in the CPE of the xDSL communication system of FIG. 1.

Referring to FIG. 4, there is shown a conventional implementation of the xDSL driver 126 of FIG. 1. The topology of the xDSL driver 126 is the same as the topology of the xDSL driver 106 of FIG. 3. The differences are in the upper and lower cut-off frequencies of the filters, a bandpass filter 302 in xDSL driver 106 and bandpass filter 402 in xDSL driver 126. For example, in the case of G.Lite DSL, the lower cut-off frequency of filter 302 in xDSL driver 106 is 150 kHz, the upper cut-off frequency of filter 302 in xDSL driver 106 is 500 kHz, the lower cut-off frequency of filter 402 in xDSL driver 126 is 30 kHz and the upper cut-off frequency of filter 402 in xDSL driver 126 is 120 kHz. The gain and output impedance of xDSL driver 106 and xDSL driver 126 are substantially the same.

Unfortunately, the performance characteristics such as gain and output impedance of the conventional xDSL drivers 106, 126 are severely affected by the tolerances of the components in the positive ($R_1$ 320, 420, $R_2$ 322, 422) and negative ($R_3$ 324, 424, $R_4$ 326, 426) feedback loops and in the reference resistor ($R_e$ 318, 418). Another disadvantage of this circuit is that the active impedance generation and filtering are realized in different stages.

Thus there is a need in the industry to provide an xDSL driver that combines active impedance generation and filtering capabilities in a single amplifier stage. Furthermore, it would be advantageous to provide a line driver that would also have an independently specified gain and output impedance as well as gain that is relatively insensitive to component tolerances.

SUMMARY OF THE INVENTION

The invention may be summarized according to a first broad aspect as a line driver having an amplifier, a transformer, a reference impedance, an input impedance, a first feedback impedance and a second feedback impedance. Preferably, the amplifier is an operational amplifier connected in an inverting configuration with an input and an output. The transformer has a primary winding and a secondary winding with a ratio of 1:n. The primary winding having a first terminal connected to the output of the amplifier and having a second terminal. The secondary winding is connectable to a transmission line having a characteristic impedance. The reference impedance is connected from the second terminal of the primary winding at a junction node to a ground reference. The input impedance having one terminal connected to the input of the amplifier and another terminal connectable to a voltage source. The first feedback impedance is connected from the junction node to the input of the amplifier and the second feedback impedance is connected from the output of the amplifier to the input of the amplifier. The second feedback impedance preferably has a value equal to (K−1) times the value of the first feedback impedance.

In accordance with this first broad aspect of the invention, the reference impedance has a value equal to $n^2/K$ times the characteristic impedance of the transmission line and the feedback circuit is arranged to produce a voltage at the output of the amplifier substantially equal to (K+1) times the voltage at the junction node, for a predetermined value of K. The resulting output impedance will be equal to K times the reference impedance and the gain will be equal to half of the negative of the ratio of the value of the second feedback impedance to the value of the input impedance.

According to a second broad aspect, the invention may be summarized as a line driver having a first amplifier, a transformer, a reference impedance, an input impedance, a first feedback impedance, a second feedback impedance and a second amplifier. Preferably, the first amplifier is an operational amplifier connected in an inverting configuration with a non-inverting input, an inverting input and an output and the second amplifier is an operational amplifier connected in a unity gain configuration with an input and an output. The transformer has a primary winding and a secondary winding with a ratio of 1:n. The primary winding having a first terminal connected to the output of the first amplifier and having a second terminal. The secondary winding is connectable to a transmission line having a characteristic impedance. The reference impedance is connected from the second terminal of the primary winding at a junction node to a ground reference. The input impedance having one terminal connected to the inverting input of the first amplifier and another terminal connectable to a voltage source. The first feedback impedance is connected from output of the second amplifier to the inverting input of the first amplifier and the second feedback impedance is connected from the output of the first amplifier to the inverting input of the first amplifier. The input to the second amplifier is connected to the junction node. The second feedback impedance preferably has a value equal to (K−1) times the value of the first feedback impedance.

In accordance with this second broad aspect of the invention, the reference impedance has a value equal to $$\frac{n^2}{K}$$

times the characteristic impedance of the transmission line. The resulting output impedance will be equal to K times the reference impedance and the gain will be equal to half of the negative of the ratio of the value of the second feedback impedance to the value of the input impedance.

The invention may be summarized according to a third broad aspect as a line driver having an amplifier, a transformer, a reference impedance, an input impedance, a first feedback impedance and a second feedback impedance. Preferably, the amplifier is an operational amplifier connected in an inverting configuration with an input and an output. The transformer has a primary winding, a first secondary winding, a second secondary winding with a ratio of 1:n:m. The primary winding having a first terminal connected to the output of the amplifier and having a second terminal. The first secondary winding is connectable to a transmission line having a characteristic impedance. The second secondary winding having a first terminal connected to a ground reference and a second terminal. The primary winding and second secondary winding are arranged such that current flowing into the first terminal of the primary winding will cause current to flow into the second terminal of the second secondary winding. The reference impedance is connected from the second terminal of the primary winding at a junction node to the ground reference. The input impedance having one terminal connected to the input of the amplifier and another terminal connectable to a voltage source. The first feedback impedance is connected from the second terminal of the second secondary winding to the input of the amplifier and the second feedback impedance is connected from the output of the amplifier to the input of the amplifier. The second feedback impedance preferably has a value equal to $$\frac{K-1}{mK}$$

times the value of the first feedback impedance.

In accordance with this third broad aspect of the invention, the reference impedance has a value equal to $$\frac{n^2}{K}$$

times the characteristic impedance of the transmission line and the feedback circuit is arranged to produce a voltage at the output of the amplifier substantially equal to (K+1) times the voltage at the junction node, for a predetermined value of K. The resulting output impedance will be equal to K times the reference impedance and the gain will be equal to half of the negative of the ratio of the value of the second feedback impedance to the value of the input impedance.

The invention may be summarized according to a fourth broad aspect as a line driver having an amplifier, a transformer, a reference impedance, an input impedance, a first feedback impedance and a second feedback impedance. Preferably, the amplifier is an operational amplifier connected in an inverting configuration with an input and an output. The transformer has a primary winding, a first secondary winding, a second secondary winding with a ratio of 1:n:m. The primary winding having a first terminal connected to the output of the amplifier and having a second terminal. The first secondary winding is connectable to a transmission line having a characteristic impedance. The second secondary winding having a first terminal connected to a ground reference and a second terminal. The primary winding and second secondary winding are arranged such that current flowing into the first terminal of the primary winding will cause current to flow into the first terminal of the second secondary winding. The reference impedance is connected from the second terminal of the primary winding at a junction node to the ground reference. The input impedance having one terminal connected to the input of the amplifier and another terminal connectable to a voltage source. The first feedback impedance is connected from the second terminal of the second secondary winding to the input of the amplifier and the second feedback impedance is connected from the output of the amplifier to the input of the amplifier. The second feedback impedance preferably has a value equal to times $$\frac{1}{mK}$$

the value of the first feedback impedance.

In accordance with this fourth broad aspect of the invention, the reference impedance has a value equal to $$\frac{n^2}{K}$$

times the characteristic impedance of the transmission line and the feedback circuit is arranged to produce a voltage at the output of the amplifier substantially equal to (K+1) times the voltage at the junction node, for a predetermined value of K. The resulting output impedance will be equal to K times the reference impedance and the gain will be equal to the ratio of the negative of the value of the second feedback impedance to the value of the input impedance.

The invention may be summarized according to a fifth broad aspect as a line driver having an amplifier, a transformer, a reference impedance, an input impedance, a first feedback impedance and a second feedback impedance. Preferably, the amplifier is an operational amplifier connected in an inverting configuration with an input and an output. The transformer has a primary winding, a first secondary winding, a second secondary winding with a ratio of 1:n:m. The primary winding having a first terminal connected to the output of the amplifier and having a second terminal. The first secondary winding is connectable to a transmission line having a characteristic impedance. The second secondary winding having a first terminal connected to a ground reference and a second terminal. The primary winding and second secondary winding are arranged such that current flowing into the first terminal of the primary winding will cause current to flow into the first terminal of the second secondary winding. The reference impedance is connected from the second terminal of the primary winding at a junction node to the ground reference. The input impedance having one terminal connected to the input of the amplifier and another terminal connectable to a voltage source. The first feedback impedance is connected from the second terminal of the second secondary winding to the input of the amplifier and the second feedback impedance is connected from the output of the amplifier to the input of the amplifier. The second feedback impedance preferably has a value equal to $$\frac{2K+1}{mK}$$

times the value of the first feedback impedance.

In accordance with this fifth broad aspect of the invention, the reference impedance has a value equal to $$\frac{n^2}{K}$$

times the characteristic impedance of the transmission line and the feedback circuit is arranged to produce a voltage at the output of the amplifier substantially equal to (K+1) times the voltage at the junction node, for a predetermined value of K. The resulting output impedance will be equal to K times the reference impedance and the gain will be equal to the ratio of the value of the second feedback impedance to the value of the input impedance.

Advantageously the output impedance of the xDSL driver is specified independently from the gain or filter function of the xDSL driver. Furthermore, the gain is a simple ratio of impedances that make the gain less sensitive to component and manufacturing variations.

Other aspects and features of the present invention will become apparent to those ordinarily skilled in the art upon review of the following description of the specific embodiments of the invention in conjunction with the accompanying figures.

DETAILED DESCRIPTION OF THE PREFERRED EMBODIMENTS

Figure 5:
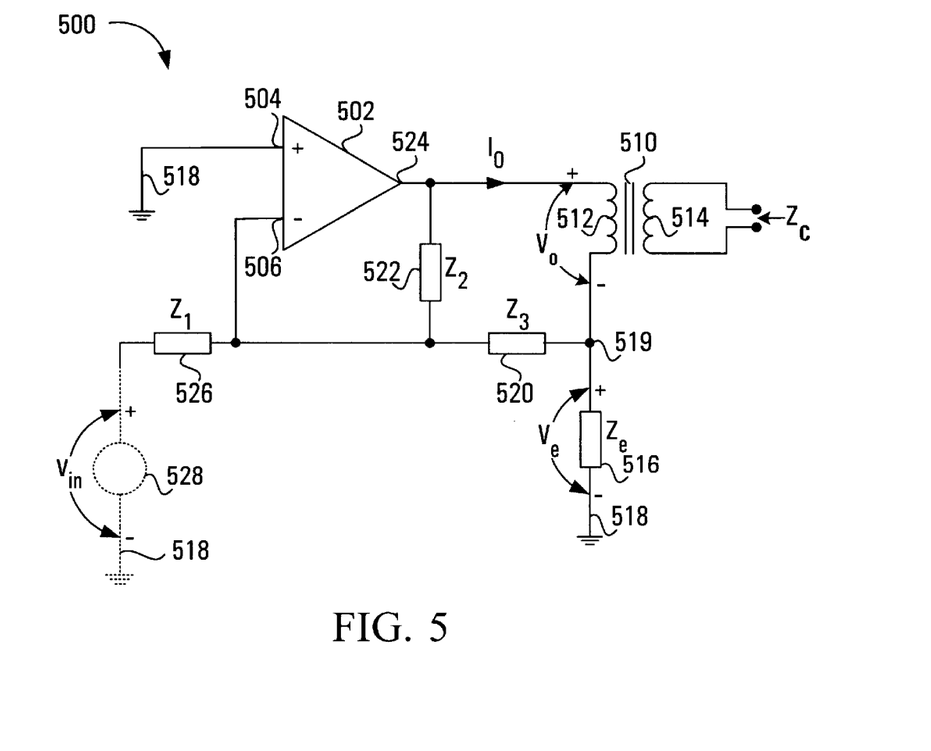
FIG. 5 is a circuit diagram of a preferred embodiment of an xDSL line driver.

In order to combine active impedance generation and filtering capabilities in a single amplifier stage, the circuit of FIG. 5 is proposed. FIG. 5 shows an xDSL line driver 500 comprising an amplifier 502 that is preferably an opamp (operational amplifier) having a non-inverting input 504, an inverting input 506 and an output 524. The non-inverting input 504 of the opamp 502 is connected to a ground reference 528. Assuming the opamp 502 to be ideal, a virtual ground exists at the inverting input 506.

The xDSL line driver also comprises a transformer 510 having a primary winding 512 and a secondary winding 514. The primary winding 512 has a first terminal connected to the output 524 of the opamp 502 and a second terminal connected to a junction node 519. The secondary winding 514 of the transformer 510 is connected across a 4-wire input of a hybrid (not shown) that has a characteristic impedance $Z_c$.

A reference impedance 516 is connected from the junction node 519 to a ground reference 518. According to a preferred embodiment of the invention, the reference impedance 516 has a value of $$Z_e = \frac{Z_c}{K}.$$

The ratio $$K = \frac{Z_c}{Z_e}$$

is a real number that preferably ranges from 1 to 10, although higher values may be used while remaining within the scope of the invention.

In the transformer 510, the ratio of primary 512 to secondary 514 turns in the transformer 510 is 1:1. Alternatively, the transformer ratio is 1:n where n≠1 and therefore $$K = \frac{n^2 Z_c}{Z_e}.$$

In alternative embodiment of the invention the transformer 510 is an integral part of the hybrid (not shown).

The xDSL driver 500 also comprises a first feedback impedance 520 having a value of $Z_3$, a second feedback impedance 522 having a value of $Z_2$ and an input impedance 526 having a value of $Z_1$. The first feedback impedance 520 has a first terminal connected to the junction node 519 and a second terminal connected to the inverting input 506 of the opamp 502. The second feedback impedance 522 has a first terminal connected to the output 524 of the opamp 502 and a second terminal connected to the inverting input 506 of the opamp 502. The input impedance 526 has a first terminal connected to the inverting input 506 of the opamp 502 and a second terminal connectable to a voltage source such as a D/A converter (shown in dotted outline at 528).

Figure 6:
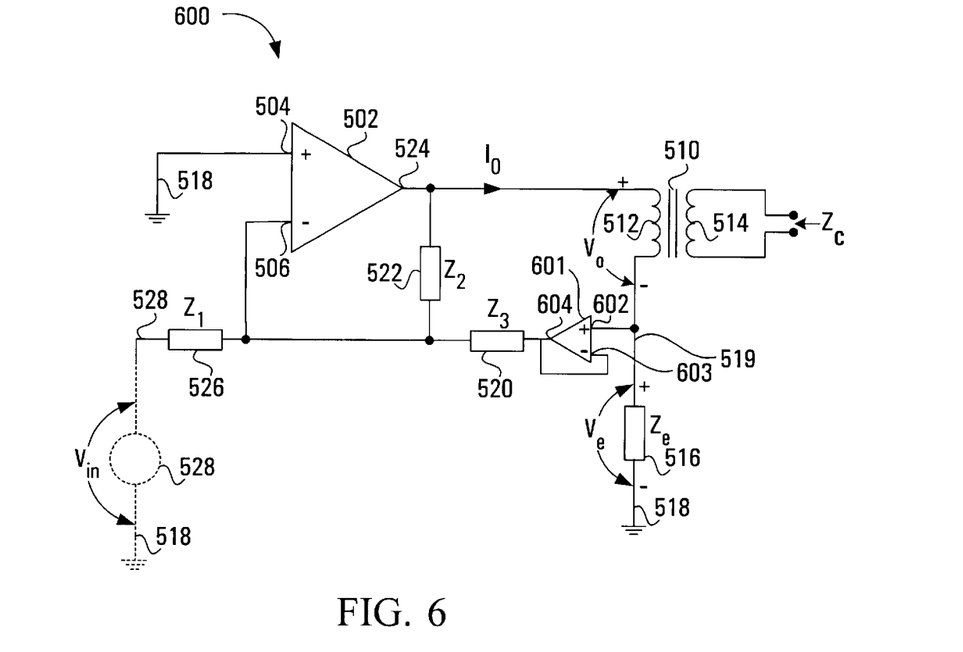
FIG. 6 is a circuit diagram of an alternative embodiment of the xDSL line driver of FIG. 5.

In an alternative embodiment, shown in FIG. 6, a second amplifier 601 having unity gain is inserted between the junction node 519 and the first terminal of the first feedback impedance 520 with the output 604 of the second amplifier 601 connected to the first terminal of the first feedback impedance 520. Preferably the second amplifier 601 is an operational amplifier configured for unity gain with the inverting input 603 connected to the output 604 and the non-inverting input 602 connected to the junction node 519. The rest of the topology of the xDSL driver 600 is identical to the topology of the preferred embodiment of the xDSL driver 500.

Figure 7A:
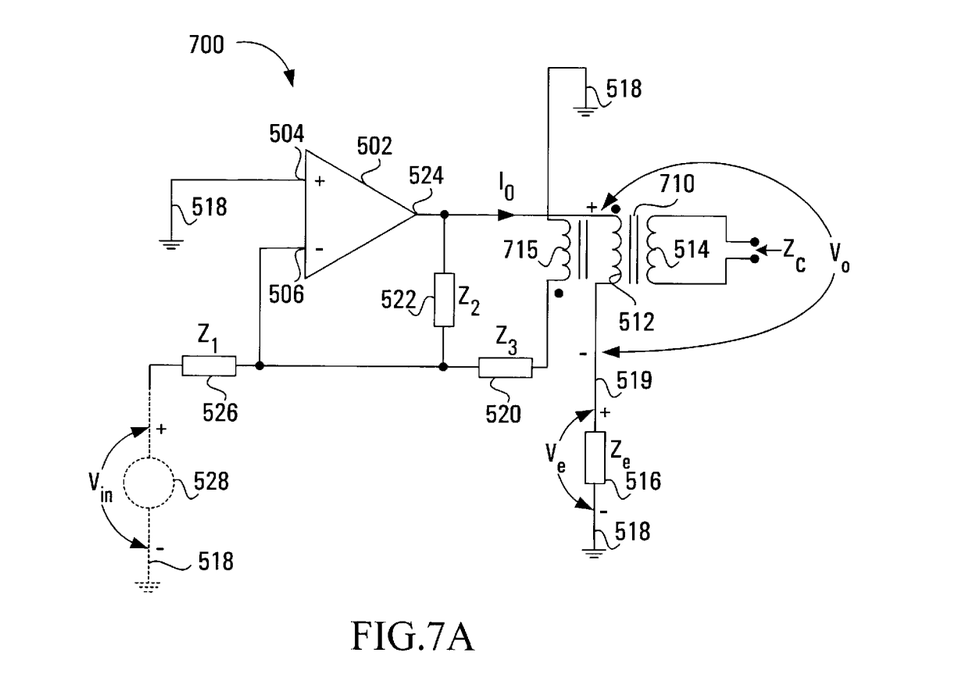
FIGS. 7A and 7B are circuit diagrams of alternative embodiments of the xDSL line driver of FIG. 5.

In another alternative embodiment, shown in FIG. 7A, the transformer 510 of FIG. 5 is replaced by a transformer 710 having a primary winding 512, a first secondary winding 514 and a second secondary winding 715. The primary winding 512 and the first secondary winding 514 of FIG. 7A are connected the same as the primary winding 512 and secondary winding 514 of FIG. 5. The second secondary winding 715 has a first terminal connected to the ground reference 518 and a second terminal connected to the first terminal of the first feedback impedance 520. The rest of the topology of the xDSL driver 700 is identical to the topology of the preferred embodiment of the xDSL driver 500. In this embodiment the preferred transformer ratio of the primary 512 turns to first secondary 514 turns to second secondary 715 turns is 1:1:1. Alternatively, the transformer ratio may be 1:n:m where n≠1 or m≠1 and hence:

$$K = \frac{n^2 Z_c}{Z_e}.$$

The directions of the primary 512 and second secondary 715 windings are chosen such that current flowing into the first terminal of the primary winding 512 will cause current to flow into the second terminal of the second secondary winding 715.

Figure 7B:
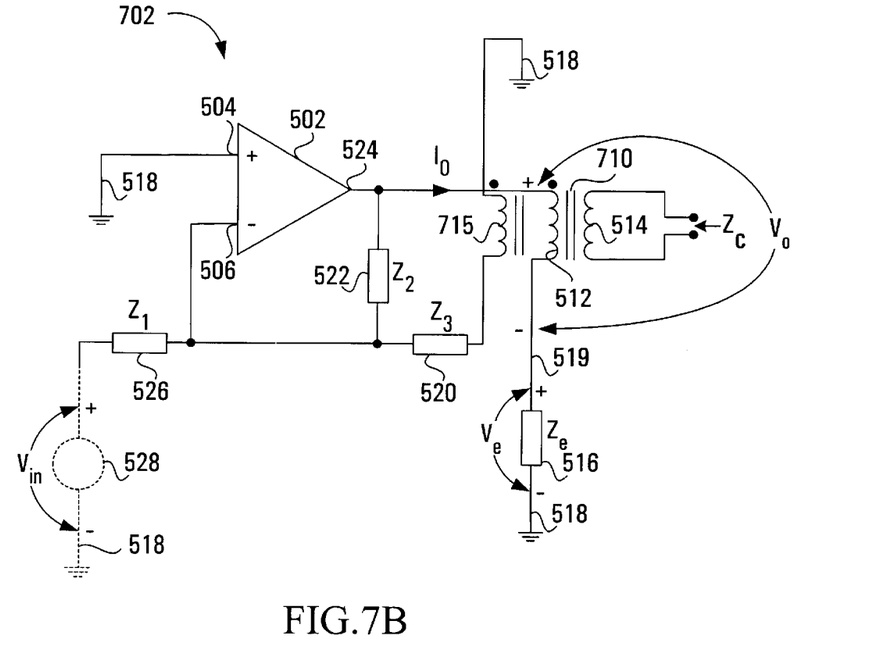

Another alternative embodiment, shown in FIG. 7B, is identical to the circuit shown in FIG. 7A except that directions of the primary 512 and second secondary 715 windings are chosen such that current flowing into the first terminal of the primary winding 512 will cause current to flow into the first terminal of the second secondary winding 715.

In the preferred embodiment shown in FIG. 5 and the alternative embodiments shown in FIGS. 7A and 7B the first feedback impedance 520 is much greater and preferably two or more orders of magnitude greater than the reference impedance 516 ensuring that the voltage on the output 524 of the amplifier 502 is substantially equal to $(K+1)V_e$. However, in the alternative embodiment of FIG. 6 this condition is unnecessary.

The following derivation is valid for the embodiments shown in FIGS. 5 and 6. The gain is derived by applying Kirchhoff's Current Law at the virtual ground of the inverting input 506 to the opamp 502:

$$\frac{V_{in}}{Z_1} + \left(\frac{V_o + V_e}{Z_2}\right) + \frac{V_e}{Z_3} = 0$$

where $V_{in}$ is the voltage between the second terminal of the input impedance 526 and the ground reference 518; $V_o$ is the voltage between the first terminal and second terminal of the primary winding 512 of the transformer 510; and $V_e$ is the voltage between the junction node 519 and ground reference 518. Since $Z_3 \gg Z_e$ (only necessary for the embodiment of FIG. 5) and $$K = \frac{Z_c}{Z_e} \text{ then } V_e = \frac{V_o}{K},$$

hence:

$$\frac{V_{in}}{Z_1} + \frac{V_o\left(1 + \frac{1}{K}\right)}{Z_2} + \frac{V_o}{KZ_3} = 0 \text{ solving for gain} = \frac{V_o}{V_{in}} \text{ gives:}$$

$$\frac{V_o}{V_{in}} = -\frac{Z_2}{Z_1\left(1 + \frac{1}{K} + \frac{Z_2}{KZ_3}\right)}$$

we choose $\frac{Z_2}{Z_3} = K - 1$ therefore $\frac{V_o}{V_{in}} = -\frac{Z_2}{2Z_1}$ The following derivation is valid for the embodiment shown in FIG. 7A. The gain is derived by applying Kirchhoff's Current Law at the virtual ground of the inverting input 506 to the opamp 502:

$$\frac{V_{in}}{Z_1} + \frac{(V_o + V_e)}{Z_2} + \frac{mV_o}{Z_3} = 0$$

where $V_{in}$ is the voltage between the second terminal of the input impedance 526 and the ground reference 518; $V_o$ is the voltage between the first terminal and second terminal of the primary winding 512 of the transformer 510; and m is the ratio of second secondary 715 turns to primary 512 turns. Since $$V_e = \frac{V_o}{K},$$

hence:

$$\frac{V_{in}}{Z_1} + \frac{V_o\left(1+\frac{1}{K}\right)}{Z_2} + \frac{mV_o}{Z_3} = 0 \text{ solving for gain} = \frac{V_o}{V_{in}} \text{ gives:}$$

$$\frac{V_o}{V_{in}} = -\frac{Z_2}{Z_1\left(1+\frac{1}{K}+\frac{mZ_2}{Z_3}\right)}$$

we choose $\frac{Z_2}{Z_3} = \frac{K-1}{mK}$ therefore $\frac{V_o}{V_{in}} = -\frac{Z_2}{2Z_1}$ The following derivation is valid for the embodiment shown in FIG. 7B. The gain is derived by applying Kirchhoff's Current Law at the virtual ground of the inverting input 506 to the opamp 502:

$$\frac{V_{in}}{Z_1} + \frac{(V_o + V_e)}{Z_2} - \frac{mV_o}{Z_3} = 0$$

where $V_{in}$ is the voltage between the second terminal of the input impedance 526 and the ground reference 518; $V_o$ is the voltage between the first terminal and second terminal of the primary winding 512 of the transformer 510; and m is the ratio of second secondary 715 turns to primary 512 turns. Since $$V_e = \frac{V_o}{K},$$

hence:

$$\frac{V_{in}}{Z_1} + \frac{V_o\left(1+\frac{1}{K}\right)}{Z_2} - \frac{mV_o}{Z_3} = 0$$

solving for gain = $\frac{V_o}{V_{in}}$ gives:

$$\frac{V_o}{V_{in}} = -\frac{Z_2}{Z_1\left(1+\frac{1}{K}-\frac{mZ_2}{Z_3}\right)}$$

we choose $\frac{Z_2}{Z_3} = \frac{1}{mK}$ therefore $\frac{V_o}{V_{in}} = -\frac{Z_2}{Z_1},$ alternatively we can choose $\frac{Z_2}{Z_3} = \frac{2K+1}{mK}$ and therefore $\frac{V_o}{V_{in}} = \frac{Z_2}{Z_1}$ Note that the gain, for all of embodiments, is independent of the reference impedance 516 and the ratio K. As well, the gain is a simple ratio of impedances making the gain less sensitive to component tolerances and manufacturing variations.

The following derivation of output impedance is applicable to the embodiments of FIGS. 5, 6, 7A and 7B. The output impedance of the xDSL line driver 500 is derived by applying Kirchhoff's Current Law to the junction node 519:

$$I_o - \frac{V_e}{Z_3} - \frac{V_e}{Z_e} = 0$$

where $I_o$ is the current flowing into the first terminal of the primary winding 512 of the transformer 510. Since $Z_3 \gg Z_e$ (unnecessary for the embodiment of FIG. 6), $$V_e = \frac{V_o}{K} \text{ and } Z_c = -\frac{V_o}{I_o},$$

and therefore:

$$Z_o = KZ_e$$

Figure 8A:
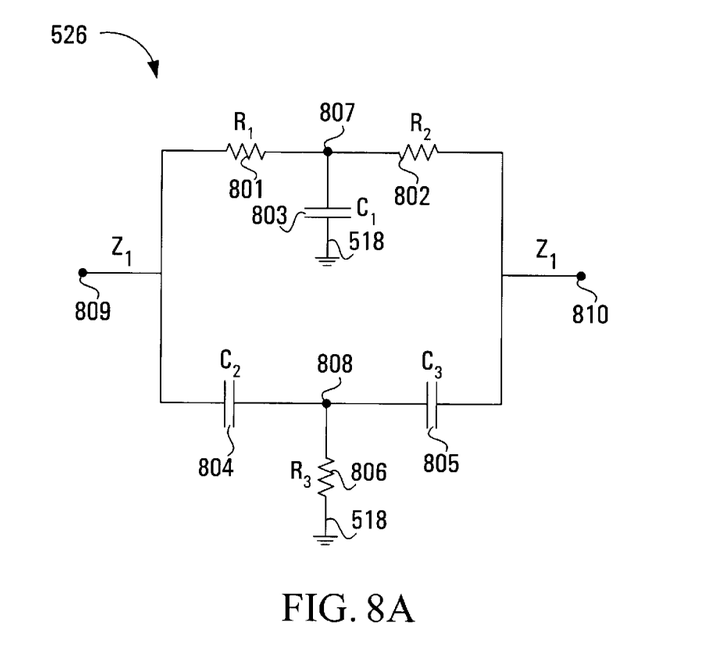
FIG. 8A, 8B and 8C show in greater detail the input impedance, the second feedback impedance and the first feedback impedance respectively of FIG. 5 in accordance with an embodiment of the invention.
Figure 8B:
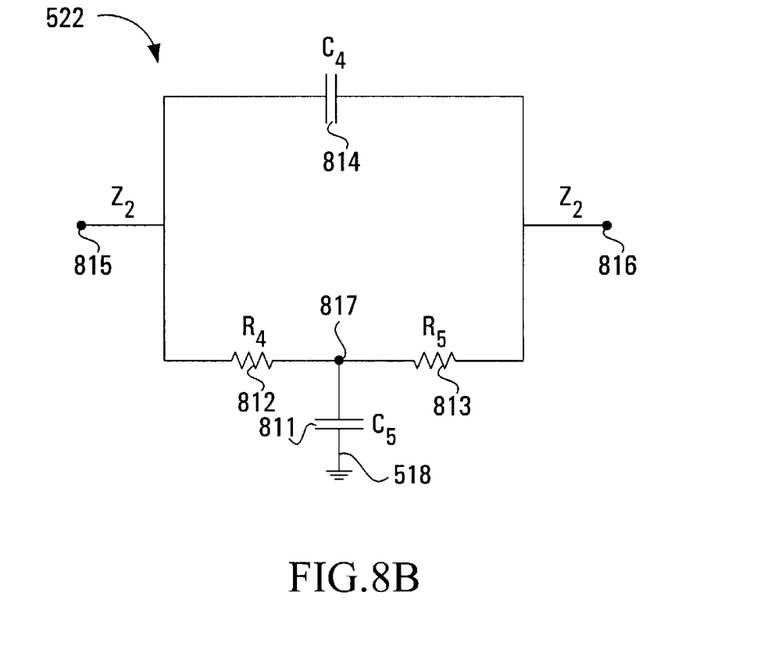
Figure 8C:
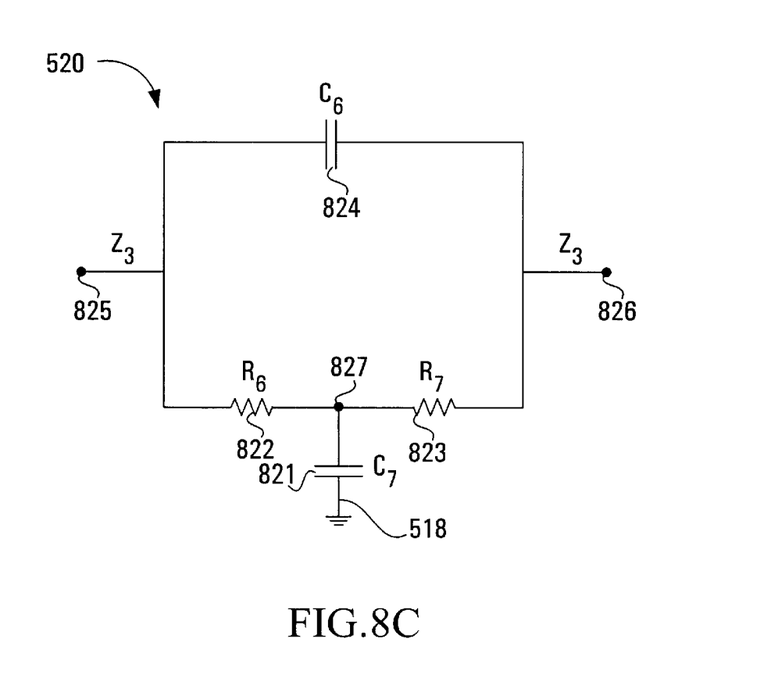

There are many possible gain functions, such as low-pass, high-pass, band-pass, band-reject or delay equalizer functions that can be realized by implementing the input impedance 526, the second feedback impedance 522 and the first feedback impedance 520 as complex impedances (i.e. networks comprising resistors, capacitors and/or inductors). FIGS. 8A, 8B and 8C show one of the possible implementations of the input impedance 526, the second feedback impedance 522 and the first feedback impedance 520 respectively.

Referring to FIG. 8A, the input impedance 526 comprises a first node 809 and a second node 810. The input impedance 526 has a first resistor 801 having a value $R_1$, a first terminal connected to the first node 809 of the input impedance 526 and a second terminal connected to a first junction node 807. The input impedance 526 also has a second resistor 802 having a value $R_2$, a first terminal connected to the first junction node 807 and a second terminal connected to the second node 810 of the input impedance 526. The input impedance 526 also has a first capacitor 803 having a value $C_1$, a first terminal connected to the first junction node 807 and a second terminal connected to a ground reference 518. The input impedance 526 also has a second capacitor 804 having a value $C_2$, a first terminal connected to the first node of 809 and a second terminal connected to a second junction node 808. The input impedance 526 also has a capacitor 805 having a value $C_3$, a first terminal connected to the second junction node 808 and a second terminal connected to the second node 810 of the input impedance 526. The input impedance 526 also has a resistor 806 having a value $R_3$, a first terminal connected to the second junction node 808 and a second terminal connected to the ground reference 518.

Referring to FIG. 8B, the second feedback impedance 522 has a first node 815 and a second node 816 with a first capacitor 814 having a value of $C_4$, a first terminal connected to the first node 815 and a second terminal connected to the second node 816. The second feedback impedance 522 also has a first resistor 812 having a value $R_4$, a first terminal connected to the first node 815 and a second terminal connected to a junction node 817. The second feedback impedance 522 also has a second resistor 813 having a value $R_5$, a first terminal connected to the junction node 817 and a second terminal connected to the second node 816. The second feedback impedance 522 has a capacitor 811 having a value $C_5$, a first terminal connected to the junction node 817 and a second terminal connected to the ground reference 518.

Referring to FIG. 8C, the topology of the first feedback impedance 520 is identical to the second feedback impedance 522. The first capacitor 824 has a value of $C_6$, the second capacitor 821 has a value of $C_7$, the first resistor 822 has a value of $R_6$ and the second resistor 823 has a value of $R_7$.

Since, in the preferred embodiment, $Z_2=(K-1)Z_3$ then $R_4=(K-1)R_6$, $R_5=(K-1)R_7$, $C_6=(K-1)C_4$ and $C_7=(K-1)C_5$.

It is preferable that $R_1=R_2$, $R_4=R_5$, $R_6=R_7$, and $C_2=C_3$.

As shown herein above, the gain of the preferred embodiment is:

$$\frac{V_o}{V_{in}} = -\frac{Z_2}{2Z_1}$$

$$\text{Since } Z_2 = \frac{1}{\frac{1}{SR_4^2 C_5} + SC_4}$$

where the variable S represents complex frequency, $$\text{and } Z_1 = \frac{1}{\frac{1}{SR_1^2 C_1 + 2R_1} + \frac{1}{\frac{1}{S^2 R_3 C_2^2} + \frac{2}{SC_2}}}$$

$$\text{therefore } \frac{V_o}{V_{in}} = -\frac{\frac{1}{R_1} \cdot \left( \frac{1}{SR_1 C_1 + 2} + \frac{S^2 R_1^2 C_2^2}{2SR_1 C_1 + \frac{R_1}{R_3}} \right)}{\frac{2}{R_4} \cdot \left( \frac{S^2 R_4^2 C_5 C_4 + 2SR_4 C_4 + 1}{SR_4 C_5 + 2} \right)}$$

by choosing $R_1 C_1 = R_4 C_5$, $C_1 = 2C_2$ and $R_1 = 2R_3$, then $$\frac{V_o}{V_{in}} = -\frac{R_4}{2R_1} \cdot \left( \frac{S^2 C_2^2 R_1^2 + 1}{S^2 R_4^2 C_5 C_4 + 2SR_4 C_4 + 1} \right)$$

This equation is a well-known form of biquad that is useful for realizing band-reject, low-pass or high-pass filters.

In an xDSL communication system it is advantageous to implement the xDSL driver 106 in the CO 101 as a high-pass filter and the xDSL driver 126 in the CPE 121 as a low-pass filter. In a G.Lite DSL communication, for example, the xDSL driver 106 in the CO 101 is a high-pass filter having a cut-off frequency of 150 kHz and the xDSL driver 126 in the CPE 121 is a low-pass filter having a cut-off frequency of 120 kHz. These filters can be designed using conventional design methodology known to those skilled in the art.

While the preferred embodiment has been describe with respect to the xDSL communication system 100 of FIG. 1, those skilled in the art will appreciate that the invention is applicable to driving any transmission line having a characteristic impedance.

While the preferred embodiment of the present invention has been described and illustrated, it will be apparent to persons skilled in the art that numerous modifications and variations are possible. The scope of the invention, therefore, is only to be limited by the claims appended hereto.

We claim:

1. A line driver, comprising:
   an amplifier having an inverting input, a non-inverting input and an output;
   a transformer having a primary winding and a secondary winding with a predetermined ratio of the primary winding to the secondary winding of 1:n, the primary winding having a first terminal connected to the output of the amplifier and having a second terminal, the secondary winding being connectable to a transmission line having a characteristic impedance;
   a reference impedance having a first terminal connected to the second terminal of the primary winding at a junction node and having a second terminal connected to a ground reference;
   an input impedance having a first terminal connected to the inverting input of the amplifier and a second terminal connectable to a voltage source;
   a first feedback impedance having a first terminal connected to the junction node and a second terminal connected to the inverting input of the amplifier;
   a second feedback impedance having a first terminal connected to the output of the amplifier and having a second terminal connected to the inverting input of the amplifier;
   wherein the reference impedance has a value equal to $$\frac{n^2}{K}$$

times the characteristic impedance of the transmission line and wherein the second feedback impedance has a value equal to (K−1) times the value of the first feedback impedance, where K is a real number; and
   wherein the first feedback impedance is chosen to be much greater than the reference impedance so that the voltage at the output of the amplifier is substantially equal to (K+1) times the voltage at the junction node;
   whereby the line driver has an output impedance substantially equal to K times the reference impedance and the line driver has a gain substantially equal to half of the negative of the ratio of the value of the second feedback impedance to the value of the input impedance.

2. The line driver of claim 1 wherein the amplifier is an operational amplifier.

3. The line driver of claim 1 wherein the predetermined ratio of the primary winding to the secondary winding is 1:1.

4. The line driver of claim 1 wherein the value of K is in the range of 1 to 10.

5. The line driver of claim 1 wherein the value of the first feedback impedance is two or more orders of magnitude greater than the reference impedance.

6. The line driver of claim 1 wherein the input impedance comprises:
   a first terminal node and a second terminal node;
   a first junction node and a second junction node;
   a first resistor, a second resistor and a third resistor; and
   a first capacitor, a second capacitor and a third capacitor;
      wherein the first resistor is connected from the first terminal node to the first junction node, the second resistor is connected from the first junction node to the second terminal node, the third resistor is connected from the second junction node to the ground reference, the first capacitor is connected from the first junction node the ground reference, the second capacitor is connected from the first terminal node to the second junction node and the third capacitor is connected from the second junction node to the second terminal node;

the second feedback impedance comprises:
  a third terminal node and a fourth terminal node;
  a third junction node;
  a fourth resistor and a fifth resistor; and
  a fourth capacitor and a fifth capacitor;
    wherein the fourth resistor is connected from the third terminal node to the third junction node, the fifth resistor is connected from the third junction node to the fourth terminal node, the fourth capacitor is connected from the third terminal node to the fourth terminal node and the fifth capacitor is connected from the third terminal node to the ground reference; and
the first feedback impedance comprises:
  a fifth terminal node and a sixth terminal node;
  a fourth junction node;
  a sixth resistor and a seventh resistor; and
  a sixth capacitor and a seventh capacitor;
    wherein the sixth resistor is connected from the fifth terminal node to the fourth junction node, the seventh resistor is connected from the fourth junction node to the sixth terminal node, the sixth capacitor is connected from the fifth terminal node to the sixth terminal node and the seventh capacitor is connected from the fourth junction node to the ground reference.

7. The line driver of claim 6 wherein the value of the first resistor is equal to the value of the second resistor, the value of the fourth resistor is equal to the value of the fifth resistor, the value of the sixth resistor is equal to the value of the seventh resistor and the value of the second capacitor is equal to the value of the third capacitor.

8. The line driver of claim 7 wherein the product of the first resistor times the first capacitor is equal the product of the fourth resistor times the fifth capacitor, the value of the second capacitor is equal to two times the value of the second capacitor and the value of the first resistor is equal to two times the value of the third resistor.

9. A line driver, comprising:
  an first amplifier having an inverting input, a non-inverting input and an output;
    a transformer having a primary winding and a secondary winding with a predetermined ratio of the primary winding to the secondary winding of 1:n, the primary winding having a first terminal connected to the output of the first amplifier and having a second terminal, the secondary winding being connectable to a transmission line having a characteristic impedance;
  a reference impedance having a first terminal connected to the second terminal of the primary winding at a junction node and having a second terminal connected to a ground reference;
  a input impedance having a first terminal connected to the inverting input of the first amplifier and a second terminal connectable to a voltage source;
  a second amplifier having unity gain, an input connected to the junction node and an output;
  a first feedback impedance having a first terminal connected to the output of the second amplifier and a second terminal connected to the inverting input of the first amplifier;
  a second feedback impedance having a first terminal connected to the output of the first amplifier and having a second terminal connected to the inverting input of the first amplifier;
    wherein the reference impedance has a value equal to $n^2/K$ times the characteristic impedance of the transmission line and wherein the second feedback impedance has a value equal to (K−1) times the value of the first feedback impedance, where K is a real number; whereby the line driver has an output impedance substantially equal to K times the reference impedance and the line driver has a gain substantially equal to half of the negative of the ratio of the value of the second feedback impedance to the value of the input impedance.

10. The line driver of claim 9 wherein the first amplifier is an operational amplifier.

11. The line driver of claim 9 wherein the value of K is in the range of 1 to 10.

12. The line driver of claim 9 wherein the second amplifier is an operational amplifier connected in a unity gain configuration.

13. The line driver of claim 9 wherein the predetermined ratio of the primary winding to the secondary winding is 1:1.

* * * * *